(12) United States Patent
Schrock

(10) Patent No.: US 9,076,899 B2
(45) Date of Patent: Jul. 7, 2015

(54) GROUNDING ELEMENT FOR SOLAR PANEL MOUNTING SYSTEMS

(71) Applicant: Sunmodo Corporation, Vancouver, WA (US)

(72) Inventor: Clifford Barry Schrock, Portland, OR (US)

(73) Assignee: Sunmodo Corporation, Vancouver, WA (US)

( * ) Notice: Subject to any disclaimer, the term of this patent is extended or adjusted under 35 U.S.C. 154(b) by 0 days.

(21) Appl. No.: 14/260,816

(22) Filed: Apr. 24, 2014

(65) Prior Publication Data

US 2014/0318604 A1 Oct. 30, 2014

Related U.S. Application Data

(60) Provisional application No. 61/817,232, filed on Apr. 29, 2013.

(51) Int. Cl.
*H01L 31/042* (2014.01)
*H01L 31/02* (2006.01)
*H01R 4/64* (2006.01)
*F24J 2/52* (2006.01)
(Continued)

(52) U.S. Cl.
CPC ............ *H01L 31/02008* (2013.01); *H01R 4/64* (2013.01); *F24J 2/5256* (2013.01); *F24J 2/52* (2013.01); *H02S 20/23* (2014.12); *F24J 2/5252* (2013.01); *F24J 2/5203* (2013.01); *H02S 20/24* (2014.12); *H02S 20/20* (2014.12); *F24J 2/5258* (2013.01); *F24J 2002/4663* (2013.01); *H01R 13/24* (2013.01); *H02S 20/00* (2013.01)

(58) Field of Classification Search
CPC ................. H01L 31/02008; H01L 31/0422; H02S 20/00; H02S 20/20; H02S 20/22; H02S 20/23; H02S 20/24; F24J 2002/4663; F24J 2/52; F24J 2/5201; F24J 2/5203; F24J 2/5252–2/526
USPC ........ 136/243–265; 174/51, 5 R, 5 SB, 5 SG; 52/173.3, 774, 204.62
See application file for complete search history.

(56) References Cited

U.S. PATENT DOCUMENTS 6,111,189 A * 8/2000 Garvison et al. ............... 136/244
7,413,790 B2 * 8/2008 Hutter, III ..................... 428/139
(Continued)

OTHER PUBLICATIONS

Spring Pin, Wikipedia, accessed on the Internet at http://en.wikipedia.org/wiki/Spring_pin on Apr. 22, 2014.
(Continued)

*Primary Examiner* — James Lin
*Assistant Examiner* — Liesl C Baumann
(74) *Attorney, Agent, or Firm* — Stone Creek Services LLC; Alan M. Flum

(57) ABSTRACT

Disclosed is a device and a system that provides a bond and ground for the mounting of solar panel systems. The grounding element is pressed into and captivity held in a mounting component of a solar panel system. This can be done during the fabrication process at the manufacturer or distributor so that the mounting component and grounding element can be transported together as a single unit. In an installed solar panel system, the mounting component that includes the captive grounding element makes contact with other elements of the solar panel mounting system and electrically bonds with them.

4 Claims, 4 Drawing Sheets

(51) Int. Cl.
| | |
|---|---|
| H02S 20/23 | (2014.01) |
| H02S 20/24 | (2014.01) |
| H02S 20/20 | (2014.01) |
| H01R 13/24 | (2006.01) |
| F24J 2/46 | (2006.01) |

(56) References Cited

U.S. PATENT DOCUMENTS

| | | | |
|---|---|---|---|
| 7,866,098 B2* | 1/2011 | Cinnamon | 52/173.3 |
| 8,448,390 B1* | 5/2013 | Clemens | 52/173.3 |
| 8,627,617 B2 | 1/2014 | Haddock et al. | |
| 2006/0037770 A1* | 2/2006 | Wade et al. | 174/51 |
| 2008/0244881 A1* | 10/2008 | Zante | 24/530 |
| 2008/0250614 A1* | 10/2008 | Zante | 24/542 |
| 2009/0183760 A1* | 7/2009 | Meyer | 136/244 |
| 2009/0242014 A1* | 10/2009 | Leary | 136/251 |
| 2011/0214365 A1* | 9/2011 | Aftanas | 52/173.3 |
| 2011/0214367 A1 | 9/2011 | Haddock et al. | |
| 2011/0214368 A1* | 9/2011 | Haddock et al. | 52/173.3 |
| 2011/0220180 A1* | 9/2011 | Cinnamon et al. | 136/251 |
| 2012/0255597 A1* | 10/2012 | Bragagna et al. | 136/251 |
| 2012/0298817 A1* | 11/2012 | West et al. | 248/220.22 |
| 2013/0200245 A1* | 8/2013 | Markiewicz et al. | 248/500 |
| 2013/0240466 A1* | 9/2013 | Sponseller | 211/26 |
| 2013/0299655 A1* | 11/2013 | Sader | 248/231.9 |
| 2014/0026946 A1* | 1/2014 | West et al. | 136/251 |
| 2014/0041706 A1 | 2/2014 | Haddock et al. | |
| 2014/0069877 A1 | 3/2014 | McPheeters | |
| 2014/0102517 A1* | 4/2014 | Meine et al. | 136/251 |
| 2015/0047177 A1* | 2/2015 | Jolley | 29/469 |
| 2015/0052712 A1* | 2/2015 | Markiewicz et al. | 24/569 |

OTHER PUBLICATIONS

WEEB Washer Electrical Equipment Bond (Brochure), Jun. 24, 2014, Burndy LLC, Londonderry, NH.

Sanantha Krishnan., WEEB Installation Instructions for Sunmodo EZ Helio System, Sep. 6, 2012, Burndy LLC, Londonderry, NH US.

Introduction to Spring Pins, Apr. 27, 2012, Drivlok, Sycamore, IL US.

Spring Pin, Wikipedia, accessed on the Internet at: http://en.wikipedia.org/wiki/Spring_pin on Feb. 11, 2015.

Spring Pins: Coiled Type, Spring Pins: Slotted Type, Machine Dowel Pins: Hardened Ground, A Grooved Pins (Metric Series) ASME 18.8.100M-2000, Incorporating ASME B18.8.3M, B18.8.4M, B18.8.5M, B18.8.9M, May 10, 2001, pp. viii, ix, and 8-15; The American Society of Mechanical Engineers, New York, NY US.

Spirol Pin Driving Chucks (Brochure), Jun. 2014, Spirol International Corporation, Danielson, CT US.

Everyone Needs a Roof, accessed on the Internet at http://www.everybodyneedsaroof.com/metal-roof-systems-for-steep-slope-applications on Feb. 13, 2015, National Roofing Contractors Association, Rosemount, IL US.

S5! The Right Way Installation Instructions, Apr. 30, 2014, s-5! Attachment Solutions Metal Roof Innovations, LTD. Colorado Springs, CO US.

UL 1004 Electric Motors Fifth Edition, Revised, Nov. 24, 1999, pp. tr1-4, 2A-B,4-5, section 9.1.8.2, Underwriters Laboratories, Northbrook, IL US.

* cited by examiner

GROUNDING ELEMENT FOR SOLAR PANEL MOUNTING SYSTEMS

CROSS-REFERENCE TO RELATED APPLICATIONS

This application claims the benefit of U.S. provisional application No. 61/817,232 filed Apr. 29, 2013, the contents of which are hereby incorporated by reference in their entirety.

BACKGROUND

This disclosure relates to the bonding and grounding of solar photovoltaic (PV) panels or solar hot water panels, herein collectively referred to as solar panels, to mounting rails or racking system, mounting clamps, and other mounting components that together comprise a solar panel system.

Solar panel systems can be rooftop or ground mounted, using rails, clamps, and adaptors held with bolts and nuts. Good engineering practice as well as the electrical codes in many locations requires, for the purpose of safety and lightning protection, that the solar panels, rails, and other components be bonded electrically together and then electrically grounded. Many solar panel systems use aluminum components for the rails, splices, mounting clamps, and panel frames. These aluminum components can be anodized to protect their finish from the elements. While aluminum is a good electrical conductor, the anodized surfaces of the aluminum components are electrical insulators. For the purpose of bonding and grounding, these anodized surfaces must be penetrated in order to obtain a good electrical connection. Alternatively, solar panel systems can use steel racking components instead of aluminum. The surfaces of the steel racking components may be galvanized or painted, or alternatively may become oxidized. While steel is an electrical conductor, the above-mentioned surfaces can act as electrical insulators. As with the aluminum rail systems, for the purpose of bonding and grounding, these steel surfaces must be penetrated in order to obtain a good electrical connection.

At present, many installers electrically connect the chassis of each solar panel together by connecting a large gauge copper conductor to each solar panel by a lug, screw, or similar fastener. Star washers, and more recently, specially formed washers can be installed between the solar panels and the rails. These washers include serrations that penetrate the anodized surfaces of both the solar panel and the rail system thereby electrically bonding the solar panel and rail system to each other. This approach can have shortcomings and disadvantages. For example, extra parts must be counted out, carried to the installation site or onto a rooftop, inserted in the correct order, and aligned correctly to perform the function of effectively bonding and grounding the components of the solar panel system. Often these tasks are performed under adverse conditions, for example, on steep rooftops and while wearing gloves and other safety equipment.

SUMMARY

This Summary introduces a concept in simplified form that is described in the Description. The Summary is not intended to identify essential features or limit the scope of the claimed subject matter. For the purposes of this disclosure, the terms "top", "bottom", "front", "back", "left", or "right" are relative terms in relationship to the drawings and are not meant to limit any interpretation of the examples in this disclosure. They are merely terms of convenience to help aid in the understanding of the drawings.

Disclosed is a device and a system for bonding and grounding the mounting components of a solar panel system that attempts to overcome the shortcomings described in the Background section. The device includes a grounding element in the form of a specially formed metal pin. The grounding element can be inserted into a hole or aperture in the body or one or more corresponding solar panel mounting components. The grounding element can be held captive and built into the mounting components simplifying both transportation and installation.

In one aspect, the grounding element includes a sharp edge or sharp points on its top surface and a slot along its length. The grounding element is held in place within the hole in the body of a solar mounting component by spring tension. The grounding element floats in the hole during the process of securing the component to other components of the solar panel system. Once the two components are secured, the sharp edge on the top surface of the grounding element penetrates the anodizing or oxidation on both surfaces and bonds the components electrically through the grounding element.

The grounding element can be produced in various lengths and diameters allowing it to be captively pressed into the various solar panel components including mounting rails, rail splices, panel clamps, and grounding lugs. Having the grounding elements inserted into the mounting components has the advantage that the installer does not have to order, inventory, or carry the separate parts. Instead the installer can simply bolt the various components together without having to add additional washers, lugs, and special grounding pieces to the solar panel system.

Taken together, the entire solar panel system, consisting of numerous solar panels, rails, clamps and splices and other components, by incorporating the grounding element in the mounting components, is bonded together electrically as a single unit which can then be connected to a single ground conductor.

DRAWINGS

DESCRIPTION

Figure 1:
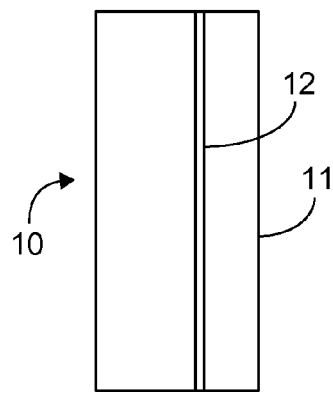
FIG. 1 shows a side view of basic roll pin commonly used in industry.
Figure 2:
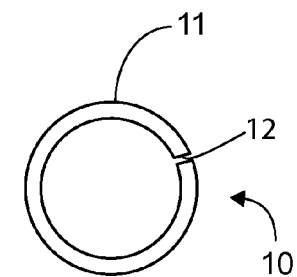
FIG. 2 is a top view of FIG. 1.

The following description is made with reference to figures, where like numerals refer to like elements throughout several views. FIG. 1 shows a side, and FIG. 2 a corresponding top view, of a roll pin 10 commonly found and used in industry to fasten two parts together such as a pulley to a shaft. The roll pin 10 is fabricated of a spring metal in a cylinder 11 with a slot 12 along the length of the pin to allow compression of the pin when inserted into a hole. The spring metal can be spring steel or spring stainless steel which has significant anti-corrosion ability when used in an outdoor environment.

Figure 3:
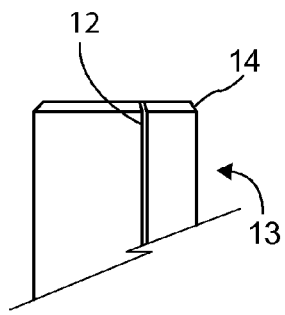
FIG. 3 shows a side view of a modification to a roll pin to make it into a grounding element.
Figure 5:
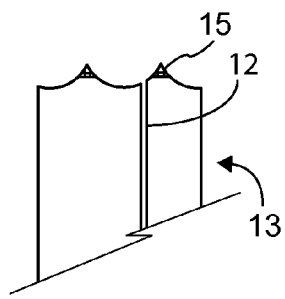
FIG. 5 shows a side view of an alternative modification to a roll pin to make it into a grounding element.
Figure 7:
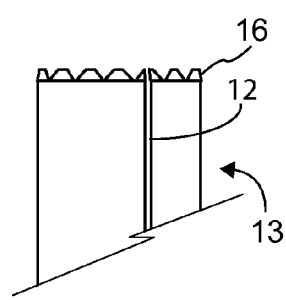
FIG. 7 shows a side view of an alternative modification to a roll pin to make it into a grounding element.
Figure 4:
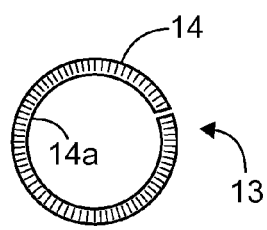
FIG. 4 shows a top view of FIG. 3.
Figure 6:
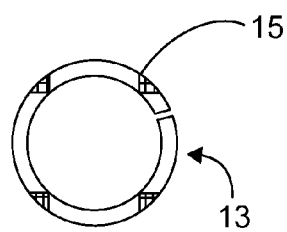
FIG. 6 shows a top view of FIG. 5.
Figure 8:
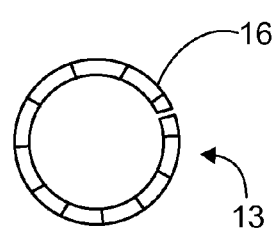
FIG. 8 shows a top view of FIG. 7.

FIGS. 3-8 show examples of grounding elements 13 fabricated from roll pins with slot 12. The grounding element 13 can have a sharp edge on either both ends or on one end. In the examples given throughout this disclosure, the sharp edge is on both ends of the grounding element 13. FIG. 3 shows a side view, and FIG. 4 shows a top view, of a grounding element 13 with a sharp edge 14 along the top surface of the grounding element 13. The sharp edge is formed by beveling in the end of the grounding element 13 so that the edge formed by the inside diameter of the grounding element 13 comes to a point 14a. FIG. 5 shows a side view, and FIG. 6 a top view, of a grounding element 13 with a sharp set of points 15 along the top edge. FIG. 7 shows a side view and FIG. 8 a top view of a grounding element 13 with a tooth edge 16. In FIGS. 3-8, the sharp edge is shaped to penetrate the anodizing commonly applied to solar racking components. However, the sharp edge is also capable of penetrating oxide, paint, or galvanized coatings. The grounding element 13 can be made in various lengths and diameters for the specific application as will be disclosed further in the drawings.

Figure 9:
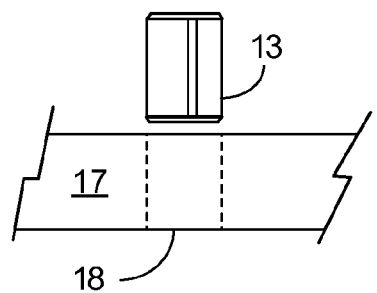
FIG. 9 shows a front exploded view of the grounding element and a metal surface with a through-hole for receiving the grounding element.
Figure 10:
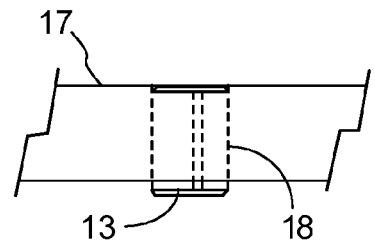
FIG. 10 shows an assembled view of FIG. 9.

FIGS. 9-10 show the use of a grounding element 13 in an application where two metal surfaces need to be bonded together during the installation of the solar system. The metal plate 17 includes a through-hole 18 between its top and bottom surfaces. FIG. 10 shows the grounding element 13 pressed into the through-hole 18 in the metal plate 17. The grounding element 13 is illustrated with broken lines to denote that it is hidden. The through-hole 18 is undersized so that the grounding element 13 is firmly held into the hole by the spring pressure. The grounding element 13 is longer than the height of the metal plate 17 so that upon tightening of mounting bolts or other securing hardware, the grounding element 13 is forced into the upper and lower surfaces. The sharp end on each end of the grounding element breaks the surface coating or oxide layer of the upper and lower surfaces creating an electrically conductive path.

Figure 11:
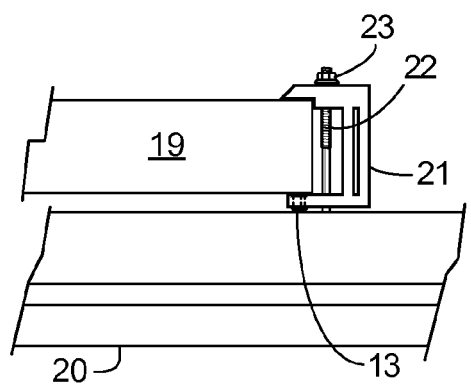
FIG. 11 shows a front view of a portion of a solar panel mounting system, where the grounding element is held captive with a solar panel end clamp.
Figure 12:
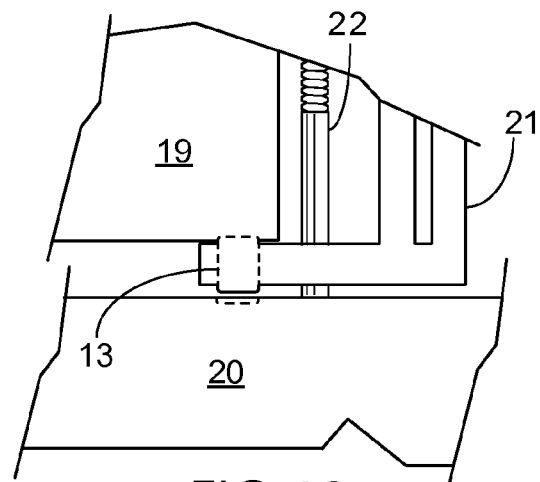
FIG. 12 shows a detailed view of a portion of FIG. 11.

FIGS. 11-12 show the solar mounting system configured for rooftop mounting with a solar panel 19, a rail 20, and an end-clamp 21. The grounding element 13 is held securely in a through-hole in the end-clamp 21 by spring action of the roller pin shape and will not fall out while the clamp is handled loosely and installed. The grounding element 13 and is longer than the height of the base of the end-clamp 21 and is positioned so that it makes electrical contact with the frame of the solar panel 19 and the rail 20. The end-clamp 21 is tightened using a bolt 22 or other threaded-fastener. The head of the bolt 22 is held captively a slot along the top of the rail 20. A nut 23, other threaded-fastener securing element, is used to tighten the end-clamp 21. The grounding element 13 is slightly longer than the height of the base of the end-clamp 21, in this case extending below the bottom surface of the end-clamp 21 base before installation. FIG. 12 shows a detail view of a portion of the end-clamp 21, the edge of the solar panel 19, the rail 20, and the bolt 22 which secures the end-clamp 21. During installation before the end-clamp 21 is fully tightened, the end-clamp 21 can be repositioned and aligned on the rail 20.

Figure 13:
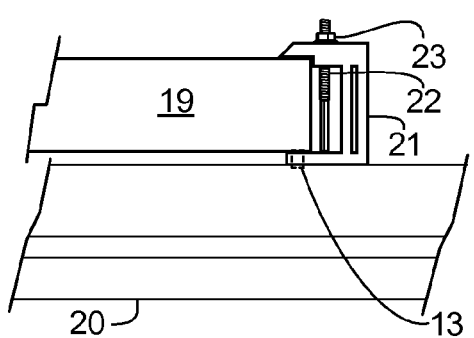
FIG. 13 shows a front view the solar panel system components of FIG. 11 showing the position of the grounding element in relation to the solar panel end-clamp and mounting rail after the end-clamp is secured to the mounting rail.

FIG. 13 show a portion of the solar panel 19, the rail 20, the end-clamp 21, and grounding element 13, in combination, after the bolt 22 and nut 23 are tightened. The bolt 22 is held captive within a rail-slot on the top of the rail 20. The rail-slot typically includes an opening and a cavity. The opening is wider than the diameter of the body of the bolt 22, but smaller than the head of the bolt 22. The cavity is large enough to receive the head of the bolt 22. As a result of tightening the nut 23 and bolt 22, the end-clamp 21 seats down on the rail 20, the grounding element 13 is driven upward to penetrate the frame of the solar panel 19 and also penetrate the rail 20. The spring action of the grounding element 13 allows it to move and center itself in the hole as it is tightened.

Figure 14:
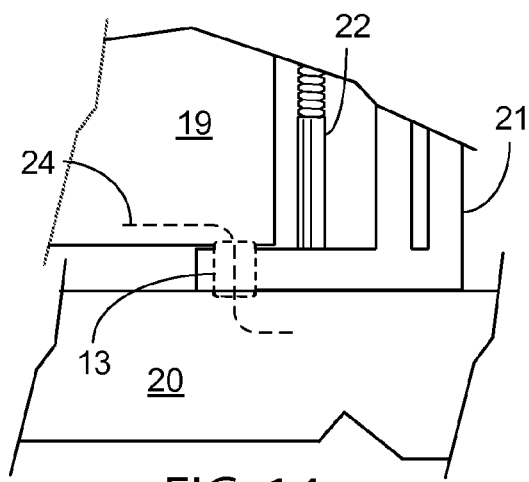
FIG. 14 shows a detailed view of a portion of FIG. 13.

FIG. 14 shows a detailed view of a portion of FIG. 13. The grounding element 13 has centered during tightening such that the sharp edge on the top of the grounding element 13 penetrates both the anodized surface of the solar panel 19 and the sharp edge on the bottom of the grounding element penetrates the anodized or oxide surface of the rail 20. The grounding element 13 creates an electrical path 24 between the solar panel 19, end-clamp 21, and the rail 20. The electrical path 24 of the ground connection between the solar panel 19 and the rail 20 is denoted by a dashed line.

Figure 15:
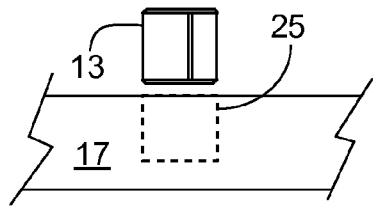
FIG. 15 shows a front exploded view of the grounding element and a portion of metal plate with a blind-hole for receiving the grounding element.
Figure 16:
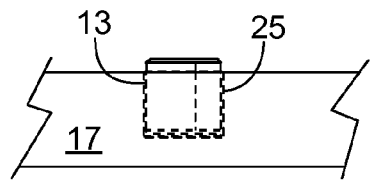
FIG. 16 shows an assembled view of FIG. 15.

FIG. 15 shows a front exploded view of the grounding element 13 and a portion of a metal plate 17 with a blind-hole 25 for receiving the grounding element 13. FIG. 16 shows an assembled view of FIG. 15. FIG. 16 shows the grounding element 13 pressed into the blind-hole 25 of the metal plate 17. The grounding element 13 may be shorter to accommodate a metal plate 17 that is thinner, and may be larger or smaller in diameter.

Figure 17:
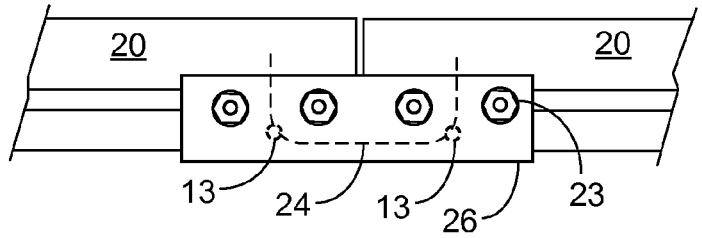
FIG. 17 shows a front view of a portion of a solar panel system where the grounding element is used with a rail splice to electrically bond to mounting rails together. The grounding elements are shown in hidden lines.
Figure 18:
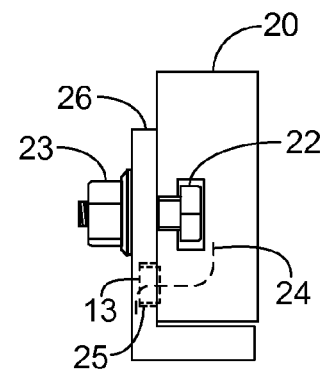
FIG. 18 shows a side view of FIG. 17 with the grounding elements shown with hidden lines.

FIGS. 17-18 show a rail-splice 26 used to join two of the rails 20. The rail-splice 26 is illustrated a have the shape of an L-bracket. The rail-splice 26 can be any shape that has sufficient structural integrity to rigidly join the rails 20 together. For example, the rail-splice 26 may in the shape of rectangular plate. This rail-splice 26 is shown securing the rails 20 together by bolts 22 and nuts 23 to the rails 20 to be spliced. Other threaded fasteners may be used, for example, screws. The rail-splice 26 has two or more of the grounding elements 13 mounted in the face of the rail-splice 26 that contacts the rail 20. The grounding elements 13 are hidden and shown represented by dashed lines. FIG. 18 shows a side view of FIG. 17 showing the relationship between the rail-splice 26, the rail 20, and the grounding elements 13 after tightening the nuts 23. Note that the grounding element 13 has centered in the blind-hole 25, the sharp edge on one end of the grounding element 13 penetrates the bottom of the blind-hole 25 in the rail-splice 26 and the opposing end of grounding element 13 penetrates the anodizing 40 of the rail 20. The electrical path 24, denoted by a dashed line, extends from each rail 20 through the rail-splice 26, thereby providing continuity from rail 20 to rail 20.

Figure 19:
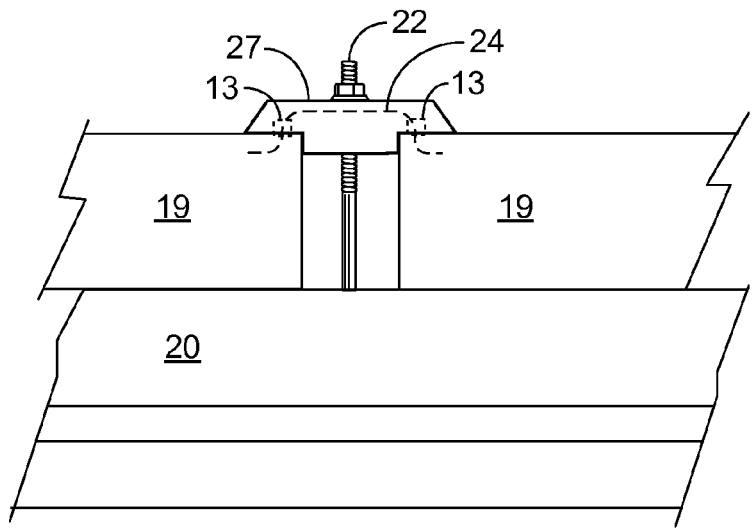
FIG. 19 shows a portion of a solar panel system where the grounding element is held captive with a mid-clamp and used electrically bond to mount two solar panels to the mounting rail. The grounding elements are shown in hidden lines.

FIG. 19 shows the grounding elements 13 used to electrically join the ground path of solar panels 19 through a mid-clamp 27. The mid-clamp 27 is shown using a bolt 22 and nut 23 to secure the edges of two of the solar panels 19 onto the rail 20. The grounding elements 13 are secured within the body of the mid-clamp 27 through corresponding blind-holes. The grounding elements 13 electrically connect the frames of the solar panels 19 together by the sharp opposing edges of the grounding elements 13 penetrating the surface coating or oxide layers as previously described. The electrical path 24, denoted by a dashed line, extends from each of the solar panels 19 through the mid-clamp 27, thereby providing bonding and continuity from solar panel 19 to solar panel 19.

Figure 20:
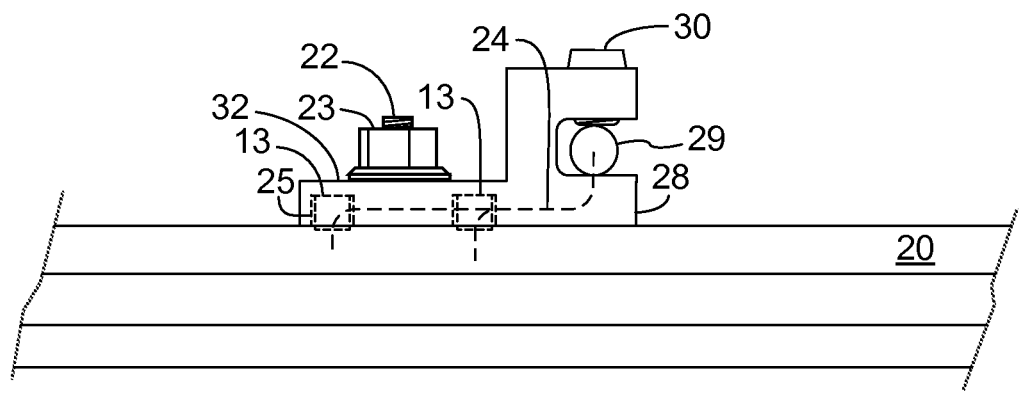
FIG. 20 shows a portion of a solar panel system with the grounding elements is used in combination with a lug to electrically bond a solar mounting rail to a wire. The grounding elements are shown in hidden lines.

FIG. 20 shows a grounding lug 28 used to electrically connect the rail 20 to a wire 29. The wire 29 can be used to electrically connect the chassis of active electrical equipment to rail 20 and as a supplemental electrical ground for the solar panel system. A nut 23 and bolt 22 secure grounding lug 28 to the rail 20. The wire 29 is clamped into the grounding lug 28 with a seizure screw 30. The grounding elements 13 are set in blind-holes 25 in the grounding lug 28. When the grounding lug 28 is tightened with the nut 23, the grounding elements 13 are compressed and centered so that the sharp edge of one end penetrates the metal in the base 32 of the blind-hole 25 and the sharp edge of the other end penetrates the anodizing of the rail 20. The electrical path 24 from the wire 29, the body of the grounding lug 28 through the rail 20 is denoted by a dashed line.

Figure 21:
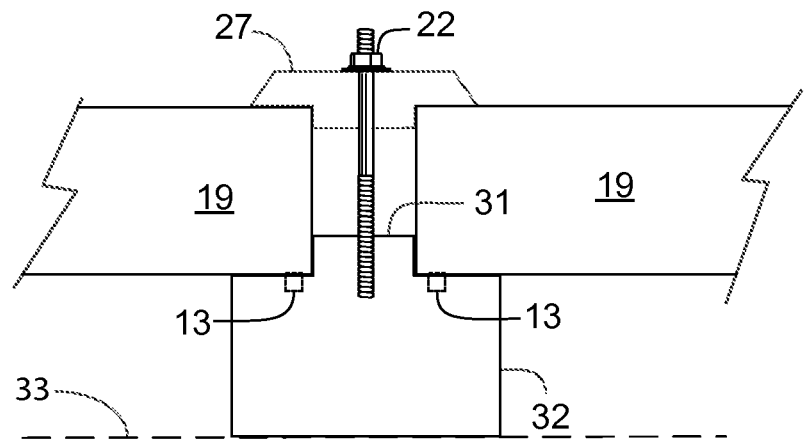
FIG. 21 shows a side view of a portion of a solar panel system where a plurality of grounding elements are used to electrically bond solar panels in a non-rail type solar mounting systems.
Figure 22:
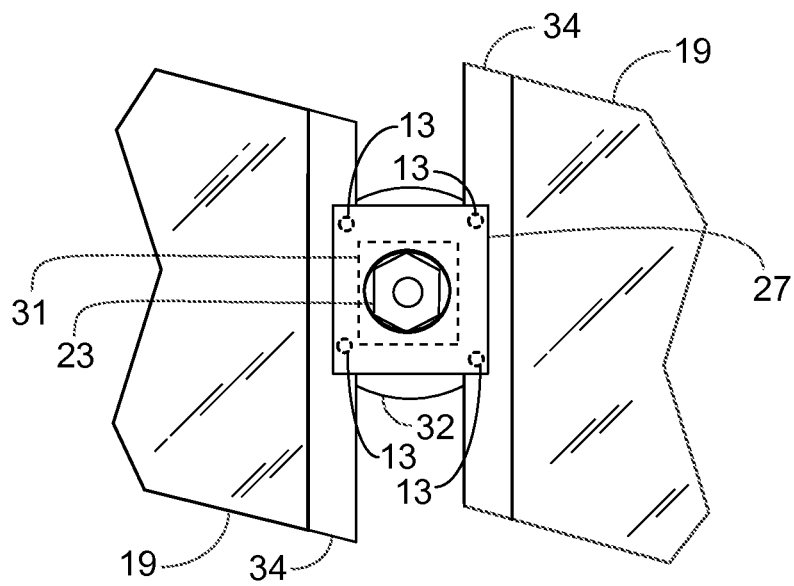
FIG. 22 shows a top view of FIG. 21.

FIGS. 21-22 shows the grounding elements 13 applied to a non-rail mounting system. FIG. 21 shows a side view and FIG. 22 a top view of the non-rail mounting system. A generic non-rail mounting system is shown for the purpose of illustration. Referring to FIGS. 21-22, the illustrated non-rail mounting system includes a stepped spacing section 31, a base 32, a mid-clamp 27, and a bolt 22 for securing the mid-clamp 27 to the stepped spacing section 31. In FIG. 22, the stepped section is hidden and represented by dashed lines. Other configurations of the non-rail mounting system may include a mid-clamp 27, or an end-clamp 21, as well as variation of the base 32, spacing, bolt 22, or nut 23. The grounding elements 13 are configured to provide a grounding path between the solar panels 19 through the base 32 of the mounting system. In the illustrated configuration, the bottom of the base 32 is shown mounted to a roof 33. The stepped spacing section 31 may be integrally formed with the base 32 or permanently secured to the base 32. The stepped spacing section 31 can be square shaped to allow for one of two orthogonally opposed orientations of the solar panels 19. For example, the stepped spacing section 31 can be oriented so that the solar panels 19 can aligned either vertically or a horizontally with respect to orientation of the roof 33. The grounding elements 13 can be located anywhere on top surface of the base 32 that makes contact with the frame 34 of the solar panel 19. The grounding elements 13 are shown located approximately adjacent to each corner of the stepped spacing section 31. In this configuration, the solar panels 19 will engage two of the grounding elements 13 independent of mounting orientation. FIG. 20 shows the solar panels 19 vertically oriented with respect. Each frame 34 of the solar panels 19 makes an electrical connection with the two of the grounding elements 13. Similarly, if the solar panels 19 and frames 34 were mounted in a horizontal orientation with respect to the roof 33, the frame 34 of each of the solar panels 19 would come in contact with two of the grounding elements 13.

A device and a system for bonding and grounding the mounting components of a solar panel system have been described. It is not the intent of this disclosure to limit the claimed invention to the examples, variations, and exemplary embodiments described in the specification. Those skilled in the art will recognize that variations will occur when embodying the claimed invention in specific implementations and environments. The appearance of the end-clamps 21, the mid-clamps 27, and rail-splices 26 throughout the disclosure is for illustrative purposes. It is the intent of the inventor that the grounding element 13 can be used in a wide range of end-clamps 21, mid-clamps 27, and rail-splices 26. Those skilled in the art will readily understand after reading what has been disclosed hereto how to apply the grounding element 13 to end-clamps 21, mid-clamps 27, and rail-splices 26 other than those illustrated. It should also be understood that even when not explicitly stated, throughout the examples in this disclosure, the sharp edge on opposing ends of the grounding element 13 penetrates the surface coating or oxide layer of the corresponding surface of contact. Throughout the disclosure, various mounting components of the solar panel system have been secured by bolts 22 and nuts 23, however, it should be understood by the reader, that threaded fasteners and threaded fastener/locking element combinations be used that have equivalent functionality can be used.

In addition, it is possible to implement certain features described in separate embodiments in combination within a single embodiment. Similarly, it is possible to implement certain features described in single embodiments either separately or in combination in multiple embodiments. It is the intent of the inventor that these variations fall within the scope of the claimed invention. While the examples, exemplary embodiments, and variations are helpful to those skilled in the art in understanding the claimed invention, it should be understood that, the scope of the claimed invention is defined solely by the following claims and their equivalents.

The invention claimed is:

1. A solar panel mounting system comprising:
  a solar panel;
  a solar panel mounting rail including a first slot along a length of a top surface of the rail;
  a solar panel end-clamp assembly including:
    a base portion resting on the top surface of the rail,
    a side portion projecting perpendicularly upward from the base portion, and
    a top portion projecting directly from and perpendicularly away from the side portion;
  a threaded fastener comprising a fastener head seated within the first slot and a fastener body that passes through the base portion and the top portion and secures the solar panel to the rail and between the base portion and the top portion; and
  a grounding element formed from a roll pin and comprising a first end and a second end; wherein
  the base portion includes a through-hole with a through-hole diameter that is smaller than a diameter of the grounding element in an uncompressed state; and the grounding element is inserted into the through-hole so that the first end and the second end extend away from opposing surfaces of the base portion, where the grounding element is movable therein; and the grounding element physically contacts the solar panel and the rail forming an electrical path therethrough.

2. The solar panel mounting system of claim 1, wherein the base portion, the side portion, and the top portion integrally form a c-shape.

3. The solar panel mounting system of claim 1, wherein the roll pin is made of spring metal and comprises a hollow cylindrical shaped body and a through-slot oriented length-wise along the hollow cylindrical shaped body from the first end to the second end; and the first end and the second end are each beveled inward from a corresponding outside edge to a corresponding inside edge of the hollow cylindrical shaped body coming to a sharpened point along the corresponding inside edge circumference.

4. The solar panel mounting system of claim 1, wherein the roll pin is made of spring metal and comprises a hollow cylindrical shaped body and a through-slot oriented length-wise along the hollow cylindrical shaped body from the first end to the second end; and the first end and the second end each include a plurality of sharpened points.

* * * * *